Aug. 30, 1966 K. G. F. MOELLER 3,269,874

THERMOELECTRIC GENERATOR WITH FLEXIBLE FLUID CONFINING TUBE EXPANSION RELIEF MEANS

Filed March 20, 1962 2 Sheets-Sheet 1

INVENTOR

KURT G. F. MOELLER

BY Howard W. Hermann

AGENT.

INVENTOR

KURT G.F. MOELLER

BY Howard W. Hermann

AGENT.

United States Patent Office 3,269,874
Patented August 30, 1966

3,269,874

THERMOELECTRIC GENERATOR WITH FLEXIBLE FLUID CONFINING TUBE EXPANSION RELIEF MEANS

Kurt G. F. Moeller, R.F.D. 3, Annapolis, Md.
Filed Mar. 20, 1962, Ser. No. 181,211
6 Claims. (Cl. 136—211)

The invention described herein may be manufactured and used by or for the Government of the United States of America for governmental purposes without the payment of any royalties thereon or therefor.

The present invention relates to thermoelectric generators, and more particularly relates to means for enhancing the heat transfer to and from the thermoelectric element of a thermoelectric generator to thereby increase the output efficiency of the generator.

A thermoelectric generator is a device comprising one or more cells for the direct transformation of thermal energy into electrical energy. Each cell of the generator makes use of the physical phenomenon of thermoelectricity, i.e. an electrical potential is developed across a block or strip of material if its opposite ends are at different temperatures. Although many materials exhibit this phenomenon to some degree, the electrical potential which is produced by a given temperature differential varies greatly with different materials. The most efficient of thermoelectric elements in use at the present time are semiconductor materials. Usually a thermoelectric cell comprises two such elements of different materials which are jointed or connected at their ends, and further comprises a heat-exchange means comprising a heat source for heating one joint and a heat exchange means for cooling the other joint. The heat-source joint or connection is usually called the hot end of the cell, and the other the cold end.

A problem inherent in all thermoelectric generators is that of minimizing the temperature drop or loss between each heat-exchange means and the respective ends of the thermoelectric elements. Obviously, if this temperature drop is minimized then for any given temperatures of the heating heat source and cooling heat sink, the efficiency of the generator is improved. For obtaining a maximum temperature differential across the thermoelectric elements good thermal contact of the thermoelectrical elements at the heat source as well as at the heat sink must be provided. However, due to thermal expansion, positive or negative, the provision of good or constant thermal contact has been a difficult one to overcome.

Since each of the different materials of the elements of the generator has a different coefficient of thermal expansion, when a cold generator is started for operation thermal stresses will occur in the generator if the elements are rigid and closely spaced or in contact. Such stresses in prior devices have at times caused breakage of the generator elements. On the other hand, if sufficient space is allowed in the generator to allow for expansion, good thermal contact is lost and heat must be transmitted across in air space. This is undesirable since the thermal conductivity of air is very poor. Under such circumstances a large temperature differential is absorbed or used up across the air space, thus reducing the efficiency of the generator.

In accordance with the present invention there is provided a generator in which air spaces are eliminated under all operating conditions of the generator by utilizing a construction that keeps a pressurized contact force between the thermoelectric elements and the heat source and heat sink, so as to maintain excellent heat transfer at all times and without the danger of breakage due to thermal expansion and contraction. In this respect, there is provided an expansible or resilient contact member at one or both ends of the thermoelectric element to provide good heat transfer throughout the system no matter what the temperature conditions may be. This provides for increased difference in temperature between the hot and cold ends of the thermoelectric elements, and thereby eliminates or at least reduces substantially the aforesaid problems inherent in prior art devices.

Accordingly, it is an object of the present invention to provide a thermoelectric battery of improved efficiency.

Another object of the invention is the provision of a thermoelectric generator which, though having great thermal-conduction efficiency, may be manufactured by simple methods which are low in cost.

A further object is to provide a thermoelectric generator constructed to maintain a positive and preferably constant heat-exchange contact at each end of each of the thermoelectric elements irregardless of the operating temperature of the system.

A still further object is the provision of a thermoelectric generator which is not subject to damage by thermal stresses.

Other objects and many of the attendant advantages of this invention will be readily appreciated as the same become better understood by reference to the following detailed description when considered in connection with the accompanying drawings which are not to scale and wherein.

Figure 1:
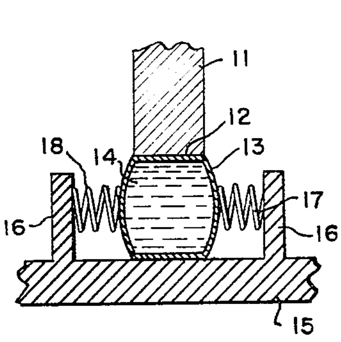
FIG. 1 is a fragmentary view in cross-section of an embodiment of the present invention.

Referring now to the drawings wherein like reference characters indicate like or corresponding parts throughout the several views, there is shown in FIG. 1 a fragmentary portion of a thermoelectric element 11 having a flat lower end face 12 in contact with a side portion of a resilient tube 13 containing a fluid 14. The tube 13 may be made of a resilient metal or other good thermal conducting material and is of relatively square cross-section, having two opposed flat sides and two opposed slightly curved sides. The curved sides are convex outward and provide sideways resiliency to the tube so that it can elongate or contract in the lengthwise direction of elements 11.

The two flat sides of tube 13 are in contact, respectively, with the lower face 12 of the thermoelectric element 11, and a flat portion of a stationary plate or wall 15 having spaced ribs 16, one at each side of the tube 13. A pair of compression springs 17 and 18 is provided between the ribs 16 and the two curved sides of the tube 13. The springs push the curved sides inwardly and hence cause the flat sides of tube 13 to press against their mating flat surfaces at the end of element 11 and at the wall 15. In the event wall 15 is also a heat sink, this action presses the bottom side or surface of tube 13 into firm thermal contact with the contiguous surface of wall 15, so that improved thermal contact is provided here also.

The tube 13 also serves as a duct for the cooling fluid 14 and thereby serves as a heat sink, and the wall 15 may also be part of a cooling duct. If the wall 15 is of electrically conducting material, a layer of insulation may be provided between the tube 13 and the wall 15 and between the tube 13 and the ribs 16 at either end of the spring 17. The other end of the thermoelectric element 11 may be either in direct contact with a heat source or alternatively may have an arrangement similar to that shown in the heat sink end illustrated in FIG. 1.

Displacements due to thermal expansion are also taken up by the tube 13 and springs 17 and 18. It will be realized that such displacements may be relatively small, so the deformations required for curved sides of the tube 13 are shown somewhat exaggerated in the drawings.

Figure 2:
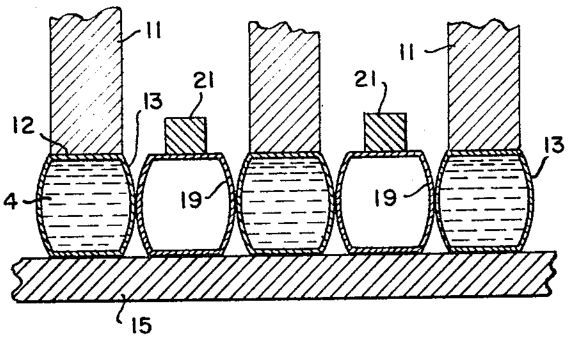
FIG. 2 is a fragmentary view in cross-section of another embodiment of the invention which is similar in many respects to the embodiment of FIG. 1.

The embodiment shown in FIG. 2 is quite similar in fundamental operation to that shown in FIG. 1. Since a large number of banks and rows of elements are usually required to build up a battery of useful voltage, the springs 17 and 18 of FIG. 1 are replaced in the embodiment shown in FIG. 2 by a plurality of special resilient tubes 19 of configuration similar to tubes 13, which tubes 19 function as springs. A plurality of positioning bars 21 are provided to coact with the wall 15 to restrict the motion of the spring tubes 19, and it will be realized that by pressurizing the tubes 19 with a fluid, the tubes 19 exert their force on the tubes 13 in the same direction as do the springs 17 and 18 of the embodiment illustrated in FIG. 1. An advantage of FIG. 2 resides in the fact that the tubes 19 when unpressurized will slide into position easily. Furthermore there is little danger that the tubes 19 will be dislodged from their position.

The pressurized tubes 13 and 19 provide a forcible positive contact at all times between the ends of each thermoelectric element and the heat-exchange means, so as to provide improved heat conduction therebetween. By maintaining a constant fluid pressure in tubes 19, a constant pressure is applied.

Figure 3:
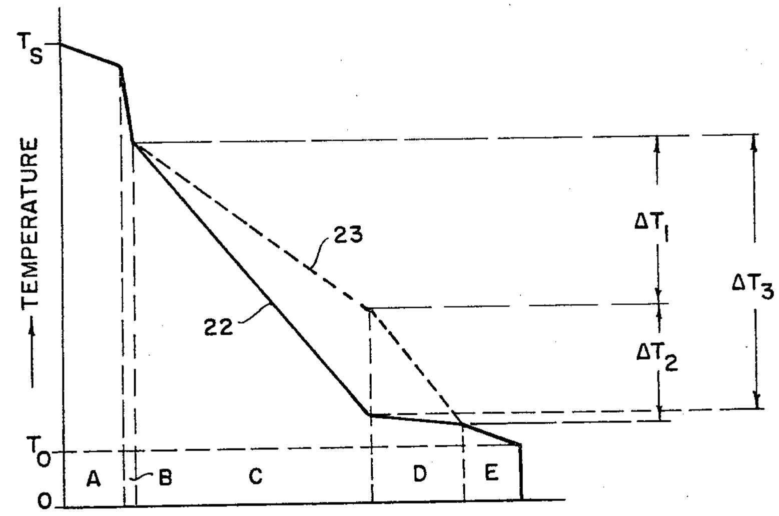
FIG. 3 is a graph having curves illustrating the heat transfer characteristics along a thermoelectric element of a construction embodying the present invention as compared with that of a prior art device for the same general purpose.

Referring now to FIG. 3, there is shown in graphical form the heat transfer characteristics across a thermoelectric element. The vertical axis represents the temperatures involved; $T_s$ being the heat source temperature and $T_0$ representing the temperature of the heat sink. $T_s$ and $T_0$ are the temperature extremes available in the generator. The solid line 22 of FIG. 3 is representative of the temperatures at various points along a thermoelectric element such as 11 in a generator made in accordance with the present invention; while the broken line 23 is representative of similar temperatures across a conventional thermoelectric generator element.

In a generator in accordance with the invention and with the wall 15 as a part of a further cooling means, then reading from left to right: $T_s$ represents the source temperature; the portion noted as A represents the temperature drop across the heat contact wall of the heat source; the narrow portion B represents the temperature drop across electrical insulation which may optionally be placed between the contact plate and the thermoelectric element; the portion C represents the temperature drop across the ends of the thermoelectric element; the portion D represents the temperature drop across the heat sink contact element which in this case is the tube 13; and finally the temperature drop of portion E represents the temperature drop across the heat sink contact plate such as wall 15; the other surface away from the element being, of course, at $T_0$, the temperature of the heat sink.

Without the positive pressure contact provided by tube 13, the temperature characteristics between B and E follow the broken line 23, and comprises a temperature drop $\Delta T_1$ across the ends of thermoelectric element, and a temperature drop $\Delta T_2$ from the cool end of the thermoelectric element to the coolest point of the battery or $T_0$. The last drop $\Delta T_2$ is larger than the corresponding drop of the new construction because of the poorer flow of heat from the cool end of the thermoelectric element to the heat sink, due to poorer thermal contact between these components.

It will be realized that for any given set of conditions wherein $T_s$ and $T_0$ are equal to the temperature differential respectively for a conventional type generator and a generator made in accordance with the invention herein disclosed, the temperature drop over the areas A, B and E of the graphs will be equal and the total drop across the system will be identical in each case. It is to be noted, however, that it is the temperature differential across the thermoelectrical element, which in the case of the conventional element is $\Delta T_1$ and in the case of the system the present invention is $\Delta T_3$, that determines the voltage available across the thermoelectric element. It is obvious from the graphs of FIG. 3 that $\Delta T_3$ is considerably greater than $\Delta T_1$, thus indicating the improvement lent by the present invention.

As is known to the art, each thermoelectric element of a thermoelectric generator may be formed of a single material or a plurality of different materials in series arrangement; and the elements may be arranged in banks and connected in series, in parallel, or in combinations of series and parallel connections. Examples are disclosed in copending application of Alton B. Neild, Jr., Serial No. 141,916, filed September 26, 1961, now Patent No. 3,197,342, to which reference may be made. Where the elements are connected in series, it is usually desirable or necessary to use thin electrical insulation at suitable points to avoid short-circuits.

Figure 4:
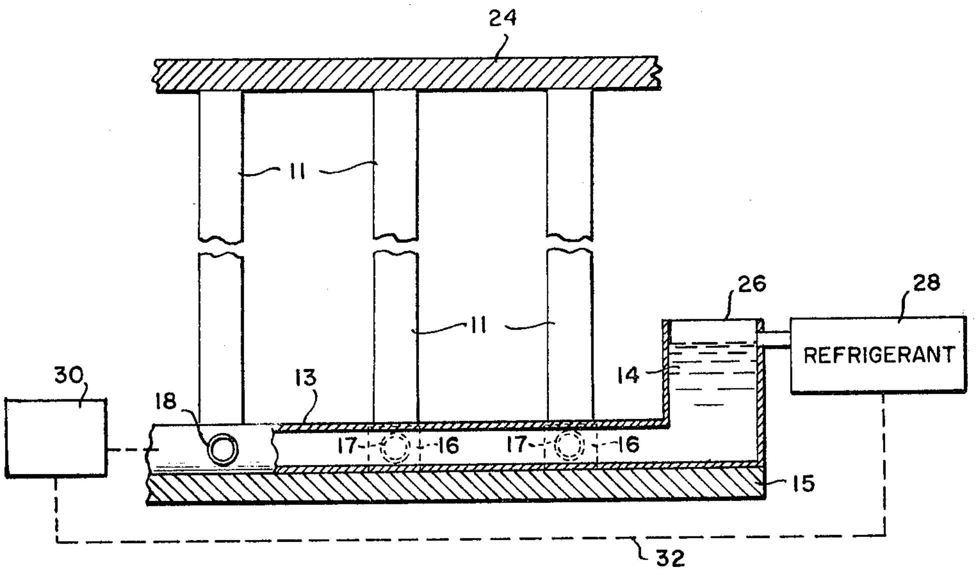
FIG. 4 is a fragmentary view, partly in cross-section and partly diagrammatic, of a construction in accordance with FIG. 1, with parallel connected thermoelectric elements arranged in a lengthwise bank.

FIG. 4 illustrates a structure of FIG. 1 utilized in a bank of thermoelectric elements connected electrically in parallel, in which case electrical insulation is not required. The lower cooler ends of a plurality of thermoelectric elements 11 rest on the upper flat side of a single tube 13 provided for the bank, it being understood that there is a tube 13 for each bank. The curved vertical sides of the tube 13 at each element are pressed inwardly or toward each other by springs 17 and 18 which are biased against ribs 16. The force of the springs forces the upper side or surface of tube 13 into good thermal contact with the lower end surfaces of the elements 11. This pressurizing force also forces the upper end surfaces of the thermoelectric elements 11 against the contiguous mating surface-portioned wall 24 of a stationary heat source, thereby establishing good thermoelectric contact at these points also, so that an improvement in thermal conductivity is also obtained at the upper ends of the thermoelectric elements. The last feature has not been indicated in FIG. 1 in the interests of brevity and clarity of explanation.

Cooling liquid is supplied to a tube 13 of a bank such as shown in FIG. 4 or to a plurality of tubes 13 or a plurality of such banks from a manifold 26 containing the cooling liquid 14 supplied from a refrigerating means 28, the intake of which is connected to the outlet of tube oɪ tubes 13 through a manifold 30 as indicated by the return connection 32 in broken lines. Preferably, but not necessarily, the fluid 14 in the tubes 13 is maintained under a slight pressure so as to assist in the aforesaid pressing action of the tube 13 against different surfaces contacted thereby. In this parallel arrangement of the elements the fluid may be water, and the tube or tubes 13 and the walls 15 and 24 may be a suitable metal appropriate to the temperatures involved.

Figure 5:
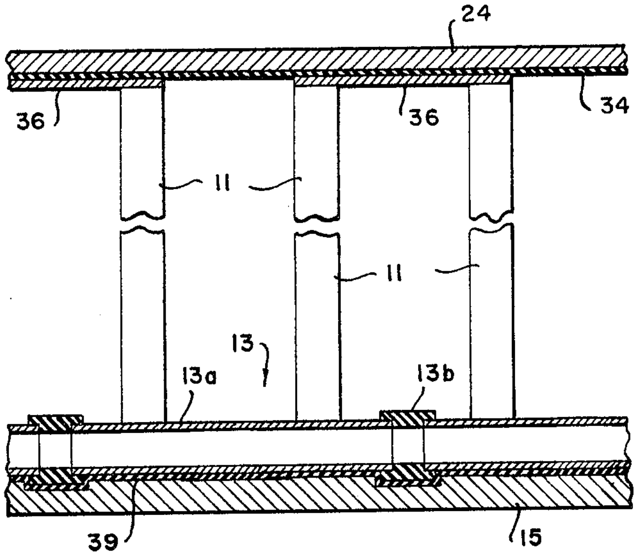
FIG. 5 is a view similar to FIG. 4 with the thermoelectric elements of the bank in series.

FIG. 5 illustrates an arrangement for series connection of thermoelectric elements. In this case, the heat-source wall 24 is lined with electrical insulation 34 such as asbestos sheet; and the tube 13 is sectionalized to comprise metal portions **13*a* alternating with electrical insulation tubular portions 13*b* which may be reinforced with embedded metal. The wall 15 may have grooves 38 for receiving the protruding portions 13*b* so that the internal cross section of portion 13*a* may be the same as or less than that of 13*b* for better maintaining the fluid pressure on the curved sides of sections 13***a*. A second layer of electrical insulation 39 is provided between the wall 15 and the tube 13 to prevent shorting between adjacent pairs of elements 11. For the series connection, electrical conducting metal strips 36 join the upper ends of each successive pair of thermoelectric elements 11, the other ends of which are electrically insulated by tubes 13*b*. The tubular metal portions 13*a* and the metal strips 36 electrically connect the cool thermoelectric elements of the bank in series.

In the embodiment shown in FIG. 2, the tubes 13 may be the heat exchange means, and the electrical arrangements may be as shown in FIGS. 4 and 5 or otherwise. However the tubes 19 preferably have no heat-exchange function and can be kept under static pressure as part of a completely closed system filled with fluid under pressure. The pressurizing fluid may be either a liquid or a gas. If the tubes 19 must be electrically insulating, they may be made of any suitable insulating material or metal covered by insulating material. If insulating properties are required for the tubes 19, the fluid therein, if liquid, may be petroleum or glycol. Should a gas be the pressurizing agent, the closed system may include a flask exposed to a higher temperature in the generator where the heat will expand the gas in the flask when the generator is started, so that the gas will exert outward pressure on the walls of tubes 19.

Obviously, many modifications and variations of the present invention are possible in light of the above teachings. It is, therefore, to be understood that within the scope of the appended claims the invention may be practiced otherwise than as specifically described.

What is claimed is:

1. In a thermoelectric battery comprising heating means, cooling means, and a thermoelectric element interposed between said heating means and said cooling means for developing a voltage thereacross, the improvement comprising;

a heat-exchanging tube interposed between one end of said thermoelectric element and said cooling means to assure positive thermal contact between said thermoelectric element and said heating means and said cooling means, said heat exchanging tube having a pair of resilient opposing side walls curved outwardly and being filled with a heat exchange fluid under pressure for forcibly pressing said heat exchange tube in a direction against the end of said thermoelectric element facing said cooling means when a force is placed against said side walls of said heat exchange tube;

resilient means pressing said pair of opposing side walls of said heat exchanging tube inwardly.

2. The invention as defined in claim 1 wherein the last said means comprises a compression spring.

3. The invention as defined in claim 1 wherein the last said means comprises a pair of resilient tubes, one at each side of said heat exchanging tube to exert a biasing force thereon.

4. The invention as defined in claim 3 wherein a fluid under pressure is contained in said resilient tubes.

5. In a thermoelectric generator:

a cooling means;

a heating means spaced from said cooling means;

a thermoelectric element between said cooling and heating means and having ends facing said cooling and heating means;

an expansible resilient element interposed between the end of said thermoelectric element facing said cooling means and the cooling means;

said resilient element comprising a tubular member;

force-means including a fluid under pressure in said tubular member for forcibly pressing said tubular member in a direction against the end of said thermoelectric element facing said cooling means, said fluid being a heat exchange fluid and means are included for forcing said heat exchange fluid through said tubular member; and said force-means comprises a pair of external coil springs pressing on the sides of said tubular member.

6. In a thermoelectric generator:

a cooling means;

a heating means spaced from said cooling means;

a thermoelectric element between said cooling and heating means and having ends facing said cooling and heating means;

an expansible resilient element interposed between the end of said thermoelectric element facing said cooling means and the cooling means;

said resilient element comprising a tubular member;

force-means including a fluid under pressure in said tubular member for forcibly pressing said tubular member in a direction against the end of said thermoelectric element facing said cooling means, said fluid being a heat exchange fluid and means are included for forcing said heat exchange fluid through said tubular member, said force-means comprises a second resilient tubular member forcibly pressing a side of the said first tubular member; and means maintaining a fluid under pressure in said second resilient tube member.

References Cited by the Examiner

UNITED STATES PATENTS

| | | | |
|---|---|---|---|
| 2,997,514 | 8/1961 | Roeder | 136—4.2 |
| 3,006,979 | 10/1961 | Rich | 136—4.2 |
| 3,048,643 | 8/1962 | Winkler et al. | 236—4.2 |

WINSTON A. DOUGLAS, *Primary Examiner.*

JOHN H. MACK, *Examiner.*

J. BARNEY, A. M. BEKELMAN, *Assistant Examiners.*